United States Patent [19]

Rambach

[11] Patent Number: 4,716,722
[45] Date of Patent: Jan. 5, 1988

[54] AIRCRAFT TURBO-JET ENGINE COMPUTER CARRIER

[75] Inventor: Daniel Rambach, Paris, France

[73] Assignee: Societe Nationale D'Etude Et De Construction De Moteurs D'Aviation "S.N.E.C.M.A.", Paris, France

[21] Appl. No.: 895,867

[22] Filed: Aug. 12, 1986

[30] Foreign Application Priority Data

Aug. 14, 1985 [FR] France ............................... 85 12367

[51] Int. Cl.$^4$ ........................... F02C 7/00; F02C 7/12
[52] U.S. Cl. ................................... 60/39.83; 361/391; 439/717
[58] Field of Search .................. 60/39.24, 39.33, 39.83; 439/716, 717, 718; 361/391, 393, 394

[56] References Cited

U.S. PATENT DOCUMENTS

| | | | |
|---|---|---|---|
| 2,609,268 | 9/1952 | Nye ..................................... | 361/391 |
| 2,880,379 | 3/1959 | Stoddart et al. ..................... | 361/391 |
| 3,202,878 | 8/1965 | Rolph et al. . | |
| 3,218,518 | 11/1965 | Ashbridge et al. ................. | 361/394 |
| 3,704,395 | 11/1972 | Hamer et al. ........................ | 361/391 |
| 3,824,472 | 7/1974 | Engel et al. ......................... | 361/391 |

FOREIGN PATENT DOCUMENTS

| | | |
|---|---|---|
| 111437 | 11/1983 | European Pat. Off. . |
| 2344201 | 3/1977 | France . |
| 1521464 | 8/1974 | United Kingdom . |

OTHER PUBLICATIONS

IBM Technical Disclosure Bulletin, vol. 24, No. 12, May, 1982, p. 687, New York, U.S.; F. Schlegel; "Plug Connector for Electronic Components."

Primary Examiner—Louis J. Casaregola
Attorney, Agent, or Firm—Oblon, Fisher, Spivak, McClelland, & Maier

[57] ABSTRACT

An assembly of an electronic computer apparatus and a carrier therefor which includes a computer apparatus casing which includes at least one side wall a front wall, a rear wall, an upper wall and, a lower wall electrical connector mechanism mounted on the side wall, coupling mechanism by which the carrier can be coupled to the computer apparatus, the carrier including a rear wall, at least one side wall, an upper wall, a lower wall, an electrical connector mechanism mounted on the side wall corresponding to the side wall of the computer apparatus on which the corresponding connector mechanism is mounted, and a coupling mechanism carried by one of the upper wall and one of the lower wall and the rear wall and arranged to couple the carrier and the computer apparatus, the coupling mechanism of the carrier including a first part enabling coupling motion of the computer apparatus to the carrier in a direction from the front to the rear of the carrier until the connector mechanism of the computer apparatus are aligned with the connector mechanism of the carrier, and a second part enabling coupling motion of the computer apparatus in a direction orthogonal to the motion permitted by the first part until the connector mechanism of the computer apparatus and of the carrier are in operative relationship.

12 Claims, 11 Drawing Figures

AIRCRAFT TURBO-JET ENGINE COMPUTER CARRIER

BACKGROUND OF THE INVENTION

1. Field of the Invention

This invention relates to carrier means for an electronic apparatus such, for example, as computers or other electronic control apparatus of aircraft gas turbines.

2. Summary of the Prior Art

It is frequently the case that electronic apparatuses incorporating computers are integrated within independent boxes which are located in control bays where various computers are interconnected and connected to various equipment units through the intermediary of connectors disposed at the rear of boxes cooperating with and belonging to the control bay. Such apparatuses are used in aerospatial electronics material principally for computers or recorders disposed within the engine housing of the aircraft. French patent specification No. 2 344 201 illustrates a framework of this kind used for carrying a "black box".

Such apparatus has only achieved resolution of the problems of "packaging" of the computer in its control bay, because the conditions of use such as temperature, vibrations and the available space are not very critical.

However, in the environment of aircraft gas turbines the situation is quite different. The latter are frequently equipped with electronic controls and a current tendency is to mount these computers on the same wall as the turbo-jet engine so as to reduce the length of the electrical connections.

Another current tendency is to provide as soon as possible a modular apparatus which can be assembled and disassembled in order to reduce the disturbance time during maintainence of the engines. In order to facilitate mounting and dismounting of a computer, attempts have been made to regroup the assembly of cables in a limited number of connectors and to arrange the regrouped cables in bundles which are often voluminous. Next the connectors are disposed on the electronic computer while movable connectors are integrated with the bundles and manually detachable in order to enable mounting and demounting of the computer. The problem arises in the mechanical strength of the cables and their location. In practice, the more the electrical connections are assembled together in large bundles, the more these become difficult to manipulate and difficult to repair. Furthermore, it is not possible, because of lack of space, to locate the fixed connectors on the wall of the computer which faces that of the gas turbine engine and the movable connectors on a corresponding wall of the carrier, because in this position which would otherwise be of interest, such would lead to mating of the connectors by the rectilinear motion of the approach of the computer towards its carrier means, as is effected in a traditional electronic bay. In practice, in the case of aircraft gas turbines, the radial space available around the turbo-reactor is of modest dimensions and a rear arrangement of the connectors and of the bundles of cables will exaggerate the lack of space radially which will be not acceptable.

Another problem to overcome is that of the susceptibility of the electronic components to vibrations which are substantial and continual in the environment close to a turbo-jet engine, and this necessitates the arrangements of the computer on a carrier comprising damping means.

The proximity of the engine causes the computer to be subjected to substantial heat flow which it is essential to reduce as far as possible in order that the components should remain within their thermal tolerance during use.

SUMMARY OF THE INVENTION

One object of the present invention is to provide carrier means for a computer used with an aircraft turbo-jet engine which enables mounting on the wall of the turbo-jet engine.

A further object of the invention is to provide carrier means which enable the location of the computer in a space of restricted thickness while maintaining the advantages of an electrical connection between the computer and the associated equipment by multi-pin connectors but at the same time avoiding the disadvantages of large bundles of cables connected to traditional multi-pin connectors.

A further object of the invention is to enable the use of wires of small diameter, and thus lighter, while at the same time having an improved versatility in exploitation by avoiding frequent and sometimes dangerous handling of these wires.

A still further object is to enable the mounting and dismounting of the computer without handling the external cabling and in the case of twin computers one of which is redundant when the other is operative, so as to permit the mounting or demounting of one only of the computer lines independently of the other line or lines.

Another object of the invention is to provide a carrier for a turbo-jet engine computer which provides for cooling of the computer and suppresses or substantially reduces vibrations resulting from the proximity of the engine.

SUMMARY OF THE INVENTION

According to the present invention there is provided in an assembly of electronic computer apparatus and a carrier therefor a computer apparatus casing comprising at least one side wall, a front wall, and a rear wall, electrical connector means mounted to said side wall, coupling means by which the computer can be coupled to the computer apparatus, said carrier comprising a rear wall, two side walls, an upper wall, a lower wall, electrical connector means mounted to a said side wall corresponding to the side wall of the computer apparatus on which the corresponding connector means is mounted, coupling means carried by one of said upper wall and said lower wall and arranged to couple the carrier and the computer, the coupling means of the carrier including a first part enabling coupling motion of the computer apparatus and the carrier in a direction from the front to the rear of the carrier until the connector means of the computer apparatus are aligned with the connector means of the carrier, and a second part enabling coupling motion of the computer apparatus in a direction orthogonal to the motion permitted by the first part until the connector means of the computer apparatus and of the carrier are in operative relationship.

In a preferred embodiment the connector means connected to the carrier is carried by an auxiliary junction box detachably secured to one side wall of the carrier, the auxiliary box comprising a distribution circuit providing for the connection of the connector with the bundles of cables provided for the various equipment of the turbo-jet engine associated with the computer and the pins of the connector means carried by the auxiliary box coacting with the pins of the corresponding connector means of the computer thourgh an opening in the side wall of the carrier.

According to one characteristic of a preferred embodiment of the invention, when it is applied to a twin computer of which one is redundant while the other is operative, the computer being formed by two lines of separate circuits disposed in two separate boxes each comprising at least one connector means, the two boxes can be superposed within the carrier and each carries a second coupling means cooperating with the first coupling means supported by the carrier, the connector means of each line of circuits cooperating with the corresponding connector means carried by the auxiliary box of the connector means. In this case a distribution circuit of the auxiliary box may provide connections of the two computers between themselves and from each of the computers to the equipment of the turbo-jet engine with which they are associated.

According to one embodiment of an auxiliary box, the distribution circuit is constituted by a printed circuit plate supporting the connector means providing for the connection with the computer or computers and connecting pins connected to the bundles of cables associated with a turbo-jet engine, the distribution circuit providing for the electrical connection between the multi-pin connector or connectors and said coupling pins.

In a modification intended for use within further reduced space limits, the auxiliary junction box can be disposed separately from the carrier, the latter comprising a fixed connector connected to the auxiliary box by a bundle of intermediate cables.

According to another characteristic of one preferred embodiment, the rear face of the carrier is traversed by an internal passages connected to a fresh pressurized fluid distribution circuit for fuel or air, the circulation of this fluid within the rear face of the carrier providing for the cooling thereof and of the associated computer.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DESCRIPTION OF THE PREFERRED EMBODIMENTS

Figure 1:
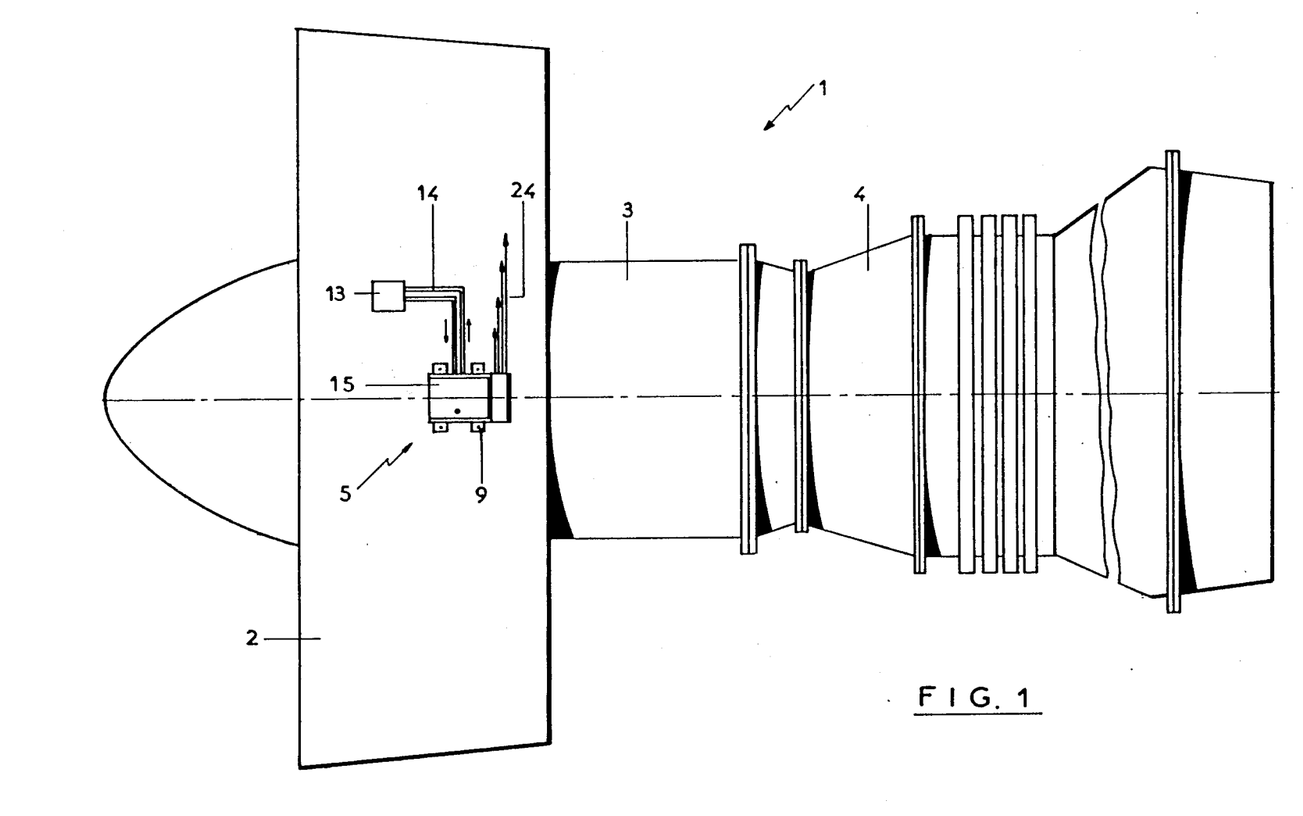
FIG. 1 shows one example of the arrangement of a computer and of its carrier in accordance with the invention when mounted on the casing wall of a turbo-jet engine.

Referring to FIG. 1, where an aircraft turbo-jet engine 1 is illustrated highly diagrammatically, it will be seen that the latter comprises a fan 2, a compressor 3, a combustion zone 4 and a turbine. Carrier means 5 in accordance with the invention is secured on the outer wall of the casing of the fan 2. It will be apparent that if the turbo-jet engine is not a twin flow type as illustrated in FIG. 1, carrier means in accordance with the invention will be disposed on the outer wall of the compressor casing, preferably the low pressure compressor which forms one of the cooler zones of the turbo-jet engine.

The carrier means 5 (FIGS. 2 and 3) comprises a rear wall 6 and upper and lower walls 7 and 8. The walls 7 and 8 include lugs 9 provided with bores 10 enabling them to be secured by means of bolts (not shown) and by vibration damping pads 11 on the wall of the casing of the engine. The rear wall 6 comprises within its thickness internal passages 12 including parts thereof parallel to one another 12a, 12b and so on, so that the passages provide for cooling over the whole of the area of the rear wall 6. The passages 12 are connected to the outlet of a pump 13 (FIG. 1) through a pressurized fuel distribution circuit 14 so that the fuel is utilized as a cooling fluid so as to cool down the carrier and thus to cool the computer which will be carried by the carrier means. The passage arrangement 12 can be connected to a fresh air distribution circuit air for which is bled from one of the first stages of the compressor of the turbo-jet engine, so that the air will serve as a coolant.

The computer is contained within a casing 15 provided on its front wall with handle members 16 and on one of the lateral walls 17 with connector means 18a connected to the computer circuit and intended to place in electrical connection the latter with corresponding connector means 18b mounted by the carrier. The connector means are disposed laterally of the computer casing so that the volume which they occupy will be disposed in the same radial space as the computer so that the latter will be mounted on its carrier and be contained within a radially limited space which is as small as possible.

The connector means 18a, 18b are interconnected through an opening 40 provided in a side wall 22 of the carrier 5 (see FIGS. 5a, 6, 7, 8). The lateral arrangement of the connector means necessitates, for placing the computer in its location within its carrier, a lateral movement from the left to the right in the examples illustrated. In order to ensure no damage to the connector pins 18a occur during the mounting and successive dismounting of the computer during maintenance in accordance with the invention coupling means of the computer are provided on its carrier which necessitate during the mounting, a first approach movement by the computer from the front towards the rear in order to align the axes of the two connectors 18a, 18b; this alignment is achieved when the rear face of the computer is in abutment against the rear face of the carrier. In a second phase of lateral movement, here from left to right, engagement of the two connectors takes place.

This double movement enables the simultaneous provision of adequate cooling of the computer by contact of its rear wall with the cooled wall 6 of the carrier and the electrical connection of the computer with equipment with which it is associated.

Figure 2:
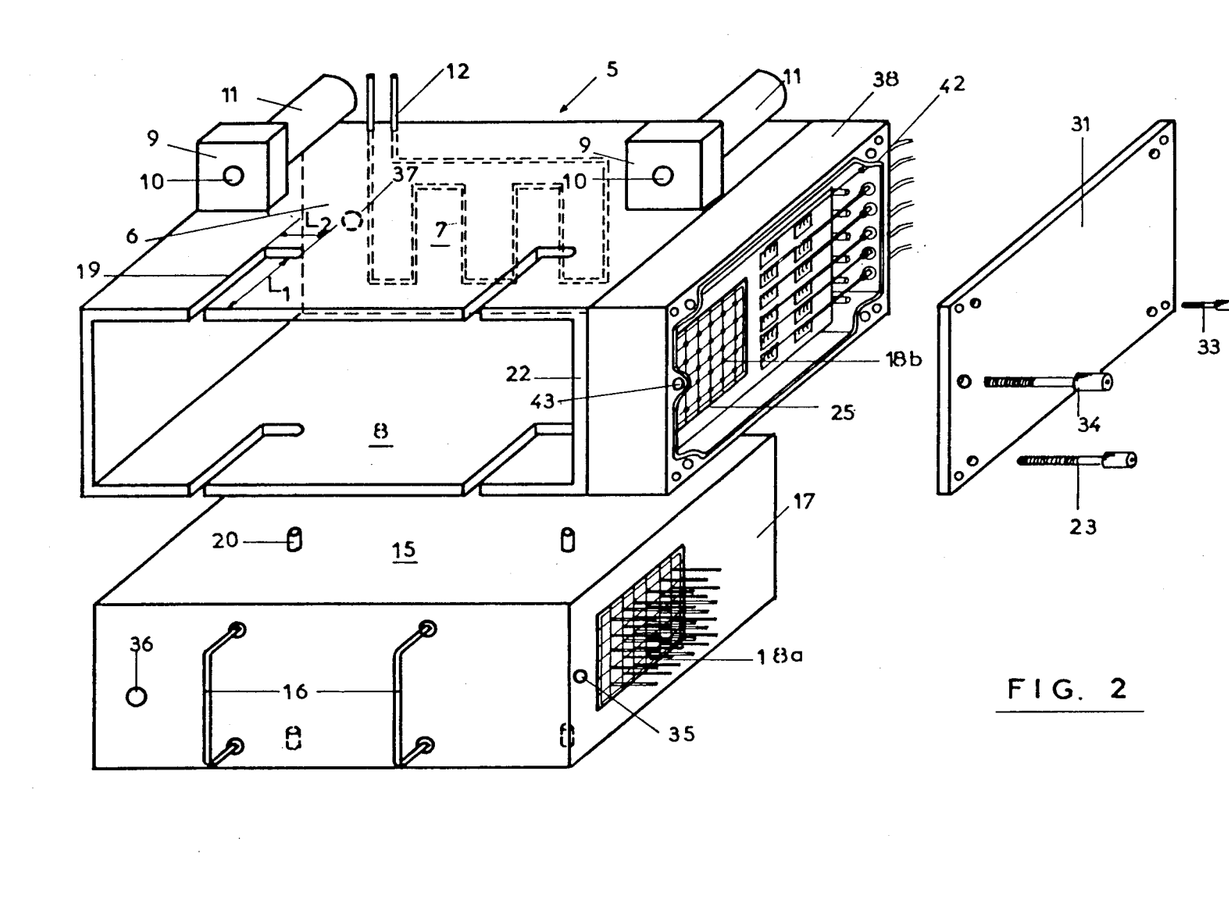
FIG. 2 illustrates in perspective, the computer of FIG. 1 and its carrier together with an auxiliary junction box in its open condition, as well as a first construction of coupling means of the computer.
Figure 3:
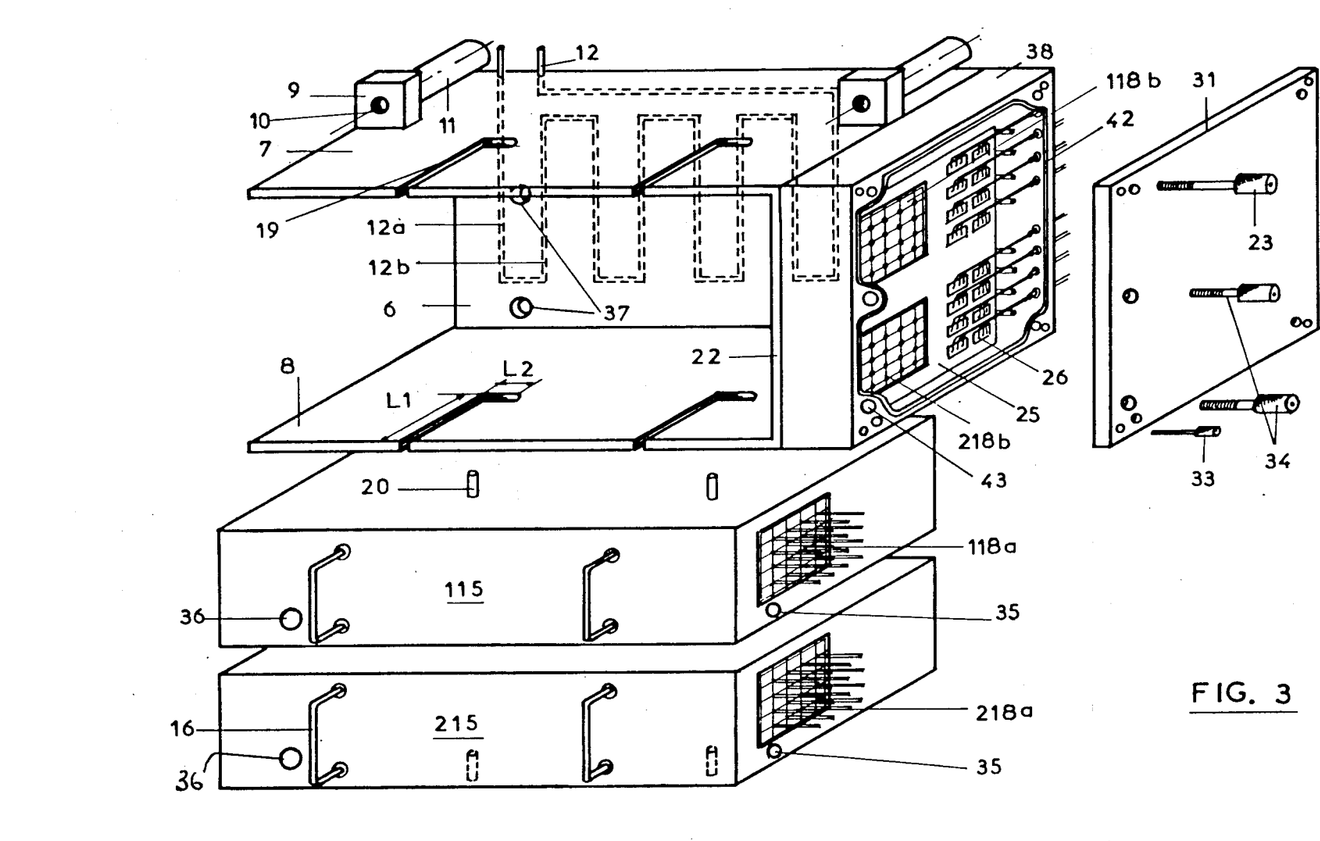
FIG. 3 illustrates application of the invention to a twin computer of which one is redundant or in other words serves as a "back-up", with the same coupling means as in FIG. 2.

To enable this two-part coupling movement, the apparatus according to the invention comprises in a first embodiment (such as illustrated in FIGS. 2 and 3) first means carried by the upper and lower walls of the carrier in the form of two-part slots 19 with one slot at right angles to the other in the manner of a bayonet fitting. The computer comprises on its upper and lower walls pegs 20 which form the second coupling means. Each double slot 19 includes a first part having a length L1 orthogonal to the base wall 6 of the carrier and the second part of length L2 parallel to the base wall, the position of the pegs 20 on the computer and the lengths L1 and L2 being so calculated that the length L1 corresponds to the contact position between the computer and the base and so that the length L2 will be at least equal to the length of the pins of the connector means 18a.

Figures 5A, 5B:
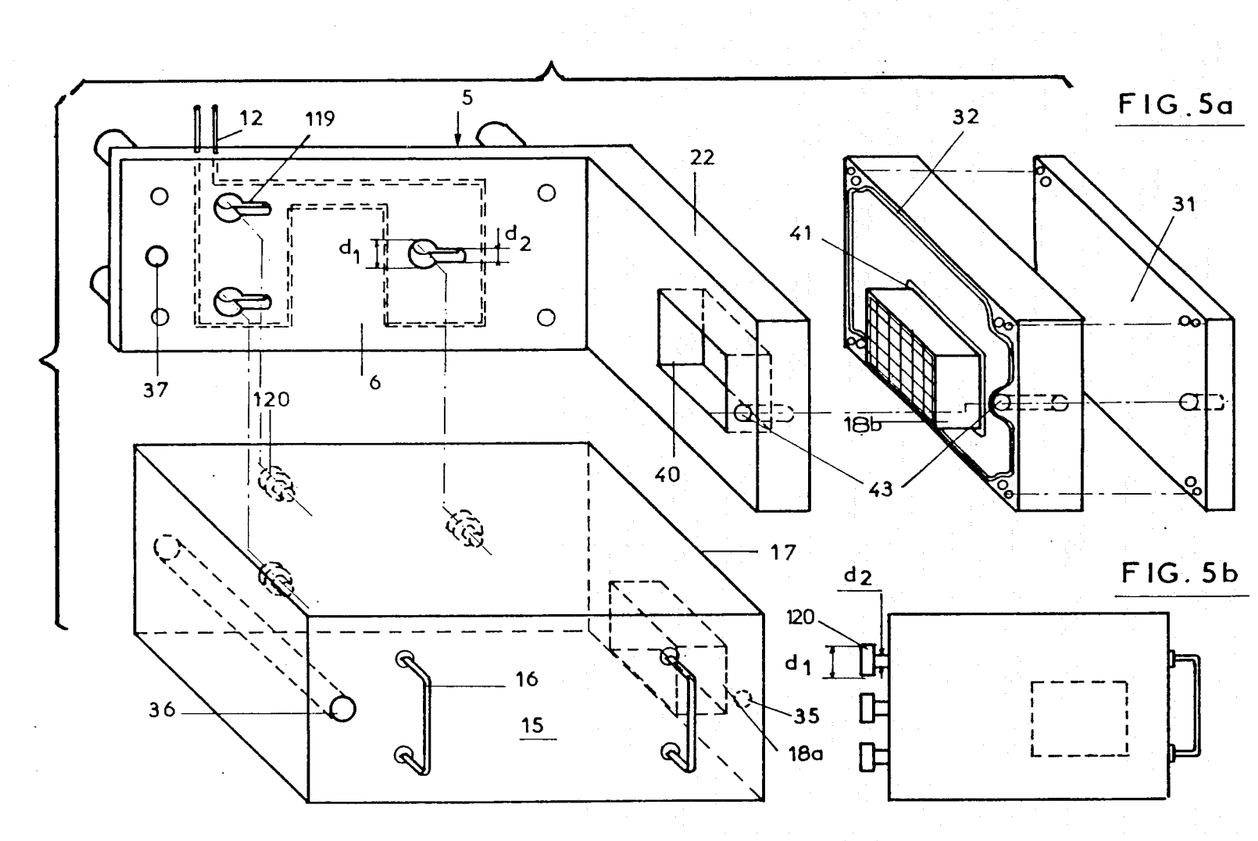
FIG. 5a and 5b show exploded perspective views of a second construction of the computer coupling means.
Figure 6:
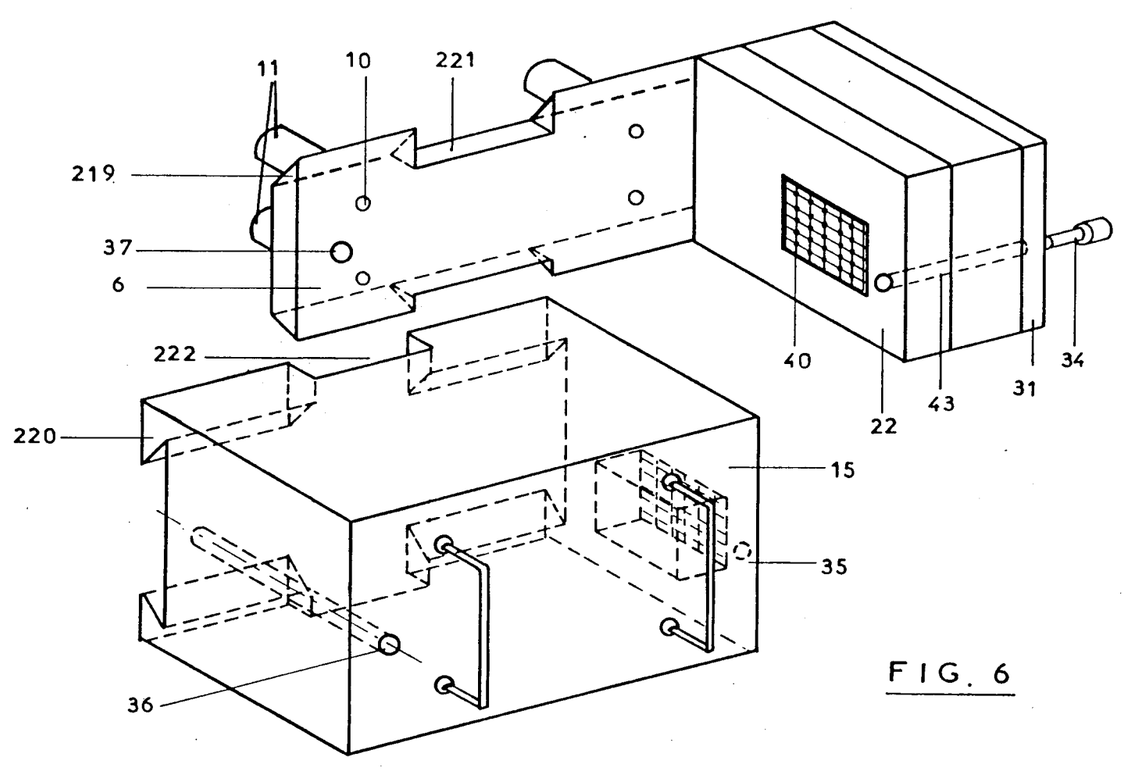
FIGS. 6, 7 and 8 illustrate three further embodiments of the coupling means.

In a second construction (FIG. 5), the coupling means are formed by button hole slots in the base 6 of the carrier including a circular opening of diameter d1 extending into an oblong hole of width d2 less than d1 and orientated in the direction of engagement of the connector. The slots cooperate with pins 120 on the base of the computer, the pins having a diameter d2 and having at their free ends enlarged heads of diameter d1, the length of the cylindrical bearing portion of diameter d2 being equal to the thickness of the base of the carrier.

In a third construction (FIG. 6), the coupling means are in the form of a casing incorporating a dovetail formation, the base 6 of the carrier comprising slide means cooperating with a groove 220 in the base of the computer. The means 219, 220 each comprise at least one slot opening respectively 221, 222 offset with respect to one another in order to enable the introduction of the computer to the carrier by a two part front/rear movement and then lateral movement.

Figure 7:
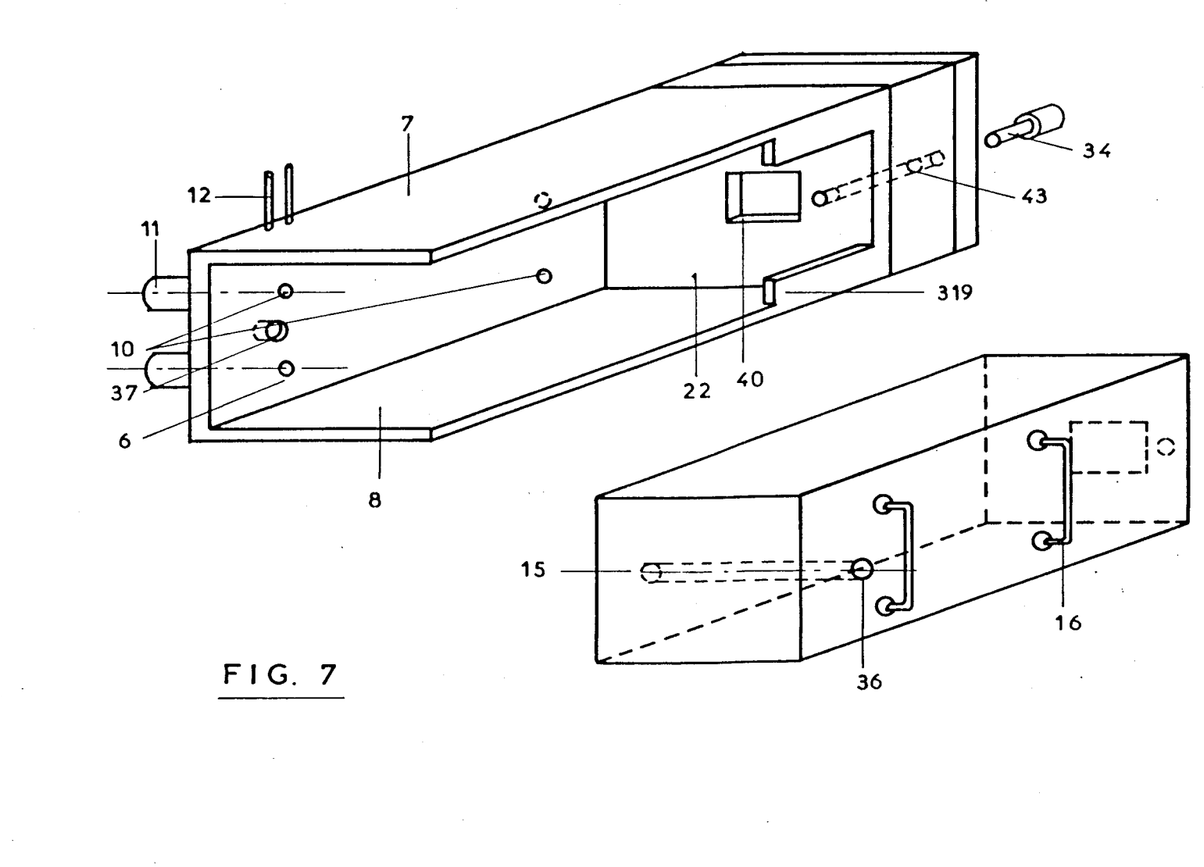
Figure 8:
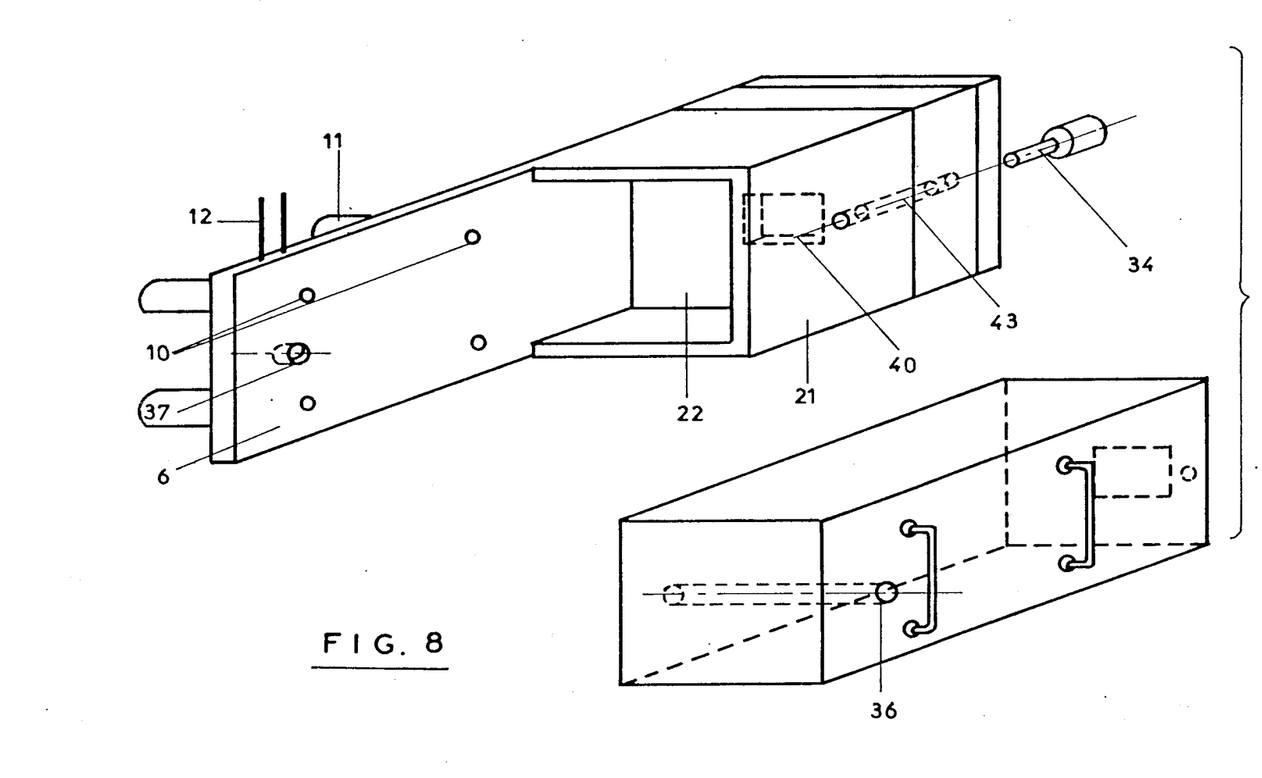

In the construction of FIG. 7, provision may be made, at the front edges of the upper and lower walls of the carrier of a slide arrangement 319 enabling guidance of the computer, while in the construction of FIG. 8, the carrier may comprise a front panel 21 so that a part of its width defines a recess in which the computer will be received.

On the side wall 22 of the carrier (FIG. 2) by any known means (for example by bolts 23) there is detachably secured an auxiliary junction box 38 providing for electrical connection between the connector 18b and the cables 24 associated with the various equipment items of components of the engine. The box 38 comprises (FIGS. 4 and 4a) an electrical distribution circuit constituted by a plate printed circuit 25 on which are soldered the rear connections of the multi-pin connector 18b. The conductors of the printed circuit 25 provide for the distribution of the various circuits to the coupling pins 26, each pin being connected to one of the cables 24 extending from externally of the box through a fluid tight seal 27. The number and shape of the cables are optimised so as to assemble together the wires in small strands as a function of their destination and to avoid excessive size and to prevent the same from becoming too heavy and too costly, so as to avoid unduly small numbers of conductors and finally to avoid bundles of conductors which are too rigid and too complex.

At the exit from the box, these cables 24 are arranged so as to occupy a space which is as small as possible.

The cables 24 include within each strand a wire 28 (FIGS. 4 and 4a) of high strength but flexible and mechanically clamped for example by an anchor bolt 29 within the box, the wire 28 being intended to resist any possible tensile force on the cable. Owing to the incorporation of the wire 28 the electrical conductors employed in the strands may be of smaller diameter and thus less heavy but at the same time having improved effectiveness in use.

The low frequency screening associated with the conductor wires is connected to the coupling pins 26 of the box in order to ensure the electrical continuity.

High frequency screening 39 associated with the cables is connected to clamping collars 30 which hold the cables at their respective entries to the interior of the box and provide for their inclusion in the metal mass of the box.

The auxiliary box (FIGS. 2 and 3) is closed by a cover 31 providing with securing screws 33. The auxiliary box 38 can be withdrawn, while remaining closed, by withdrawing the screws 23, which must then be withdrawn from the exterior of the cover 31.

Figure 4:
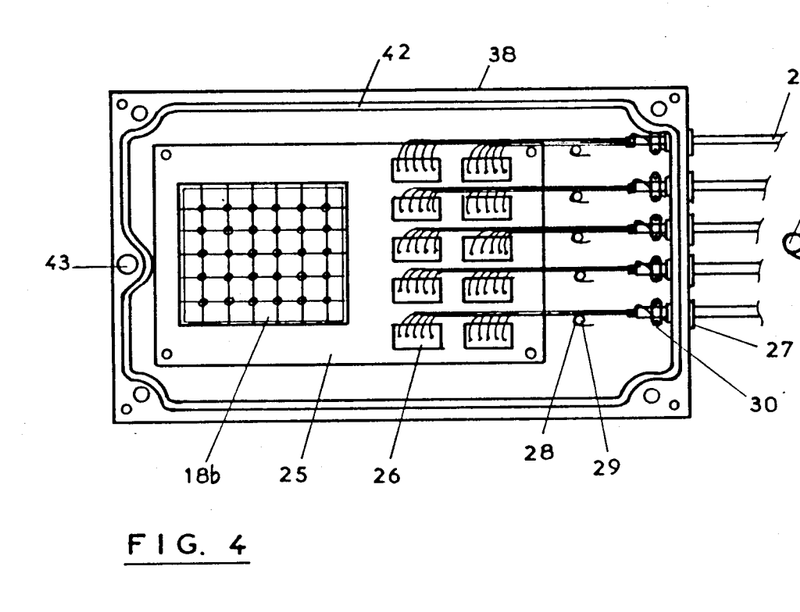
FIG. 4 is a side view of the carrier showing the auxiliary junction box, with the cover removed.
Figure 4A:
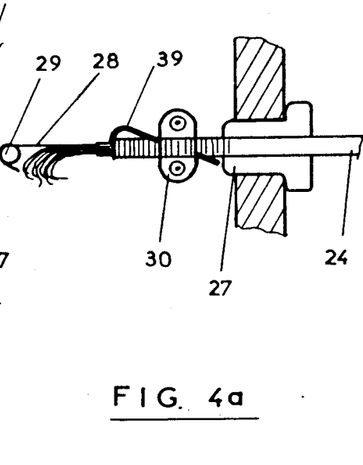
FIG. 4A shows a detailed view of FIG. 4.

Fluid-tightness is provided between the auxiliary box and the carrier by seals 32 and 41 (FIGS. 5a) and between the auxiliary box and its cover by a seal 42 (FIG. 4).

A further arrangement enables simplification of encasing of the connectors 18a and 18b. This arrangement may be formed simply by a system of screws 34 and tapped bores 35 of the computer, the screw 34 engaging a tapped bore 35 through bores 43 of the auxiliary box of the carrier and of the cover. This arrangement can also be replaced by any other similar or alternative arrangements for example by a hand-operated lever assembly enabling reducing the force necessary for mating of the connector pins.

Furthermore, it is possible to provide a locking means for the computer in the active location in the carrier, such as a screw traversing a bore 36 of the computer and cooperating with a screw thread bore 37 in the carrier.

In the case (FIG. 3) where a twin computer is used including a redundant one comprising two lines of computing circuit means in parallel, each line of computing circuit means being disposed within an individual box 115,215 and comprising connector means 118a, 218a, the distribution circuit 25 provides for connections between the two computers by means of corresponding connectors 118b, 218b which it carries, and also between each computer and the equipment with which it is associated, by means of pins 26.

Figure 9:
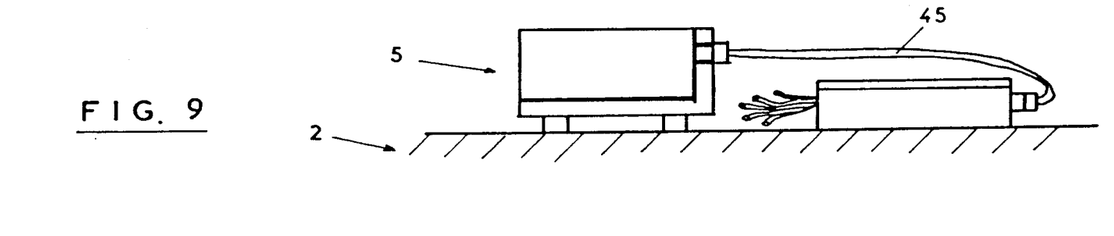
FIG. 9 illustrates the case where because of weight or space limitations, the auxiliary junction box is disposed on the turbo-jet engine separately from the carrier.

In the case where the available space is much reduced around the turbo-jet engine, it is possible to separate the carrier and the auxiliary junction box, and the connectors 18a and 18b will be interconnected by an intermediate cable bundle 45 comprising a connector at each end (FIG. 9). The advantage of such a carrier is to enable the disposition of a modular computer on the wall of a turbo-jet engine while facilitating maintenance operations, for mounting and demounting of the computer or computers while at the same time avoiding large bundles of heavy and bulky cables.

Another advantage is that the inclusion of the auxiliary box facilitates specific electrical operations such as measurement, bridging, cutting, modification or repair of a given cable strand without having to manipulate the other strands.

In this way the versatility is improved of electrical connections between the computer and the corresponding equipment.

Obviously, numerous modifications and variations of the present invention are possible in light of the above teachings. It is therefore to be understood that within the scope of the appended claims, the invention may be practiced otherwise than specifically described herein.

What is claimed is:

1. In an assembly of an electronic computer apparatus and a carrier therefor
   a computer apparatus casing comprising
      at least one side wall
      a front wall,
      a rear wall,
      an upper wall and,
      a lower wall
      electrical connector means mounted on said side wall,
      coupling means by which the carrier can be coupled to the computer apparatus,
   said carrier comprising
      a rear wall,
      at least one side wall,
      an upper wall,
      a lower wall,
      electrical connector means mounted on said side wall corresponding to the side wall of the computer apparatus on which the corresponding connector means is mounted, and
      coupling means carried by one of said upper wall and one of said lower wall and said rear wall and arranged to couple the carrier and the computer apparatus, the coupling means of the carrier including
         a first part enabling coupling motion of the computer apparatus to the carrier in a direction from the front to the rear of the carrier until the connector means of the computer apparatus are aligned with the connector means of the carrier, and
         a second part enabling coupling motion of the computer apparatus in a direction orthogonal to the motion permitted by the first part until the connector means of the computer apparatus and of the carrier are in operative relationship.

2. An assembly according to claim 1, further comprising an auxiliary junction box on which the connector means of the carrier are mounted, and means detachably securing said junction box to said at least one side wall of the carrier.

3. An assembly according to claim 2 wherein the auxiliary junction box comprises a distribution circuit for connection of the connector means with cable bundles of equipment of a turbo-jet engine associated with the computer apparatus.

4. An assembly according to claim 2 wherein the connector means of the auxiliary box comprise female connectors and the connector means of the computer apparatus comprise male connectors, wherein said at least one side wall of the carrier comprises a side wall on which the connector means thereof are mounted, having an opening through which the connector means of the computer apparatus and of the carrier are engaged.

5. An assembly according to claim 3 wherein the computer includes two distinct lines of computing means and the assembly further includes two separate casings one for each computing means, each casing carrying one said connector means, the two casings being superposed within the carrier and each carrying said coupling means cooperating with the coupling means of the carrier, said connector means of each line of computing means cooperating with corresponding said connector means of the carrier and the distribution circuit of the auxiliary junction box provides for the electrical inter-connection of the two computing means and for the electrical connection of the computing means with equipment of the said turbo-jet engine.

6. An assembly according to claim 3 wherein the distribution circuit includes a printed circuit plate supporting the connector means for providing the connection with the computer apparatus and also supporting coupling pins connected to cable bundles of the said turbo-jet engine, the distribution circuit serving to provide electrical connection between the connector means and the said coupling pins.

7. An assembly according to claim 1 wherein the coupling means of the carrier are formed by slots of bayonet form the computer apparatus comprises upper and lower walls and the second coupling means are formed by pegs mounted on the said upper and lower walls of the computer apparatus.

8. An assembly according to claim 1, wherein the coupling means of the carrier are formed by openings in the rear wall thereof in the shape of a button hole orientated perpendicularly to the side walls of the said carrier and cooperating with the coupling means of the computer apparatus in the form of pins with an enlarged head carried by the rear wall thereof.

9. An assembly according to claim 1 wherein the coupling means of the carrier comprise means defining a slide on the rear wall thereof, said slide including at least one slot along its length and the computer apparatus defines a groove of dovetail form including at least one inlet slot corresponding to that of the slide, said slots enabling the computer apparatus to be finally located in the carrier by said two successive motions orthogonal to one another.

10. An assembly according to claim 1 and further incorporating an aircraft gas turbine plant, the assembly further including vibration damping devices by which the assembly is mounted on the gas turbine plant.

11. An assembly according to claim 1 wherein the said rear wall of the carrier is traversed by an internal passage arranged to be connected to a pressurized fuel distribution circuit, the flow of the pressurized fuel within the rear wall of the carrier ensuring by contact between the carrier and the computer, the cooling of the latter.

12. An assembly according to claim 1 wherein the rear wall of the carrier is traversed by an internal passage arranged to be connected to a fresh air distribution circuit bled from the first stages of the compressor of a turbo-jet engine, the flow of air within the rear wall of the carrier providing by contact between the carrier and the computer, for cooling of the latter.

* * * * *